United States Patent [19]

Stevenson

[11] 4,371,420
[45] Feb. 1, 1983

[54] METHOD FOR CONTROLLING IMPURITIES IN LIQUID PHASE EPITAXIAL GROWTH

[75] Inventor: David A. Stevenson, Los Altos Hills, Calif.

[73] Assignee: The United States of America as represented by the Secretary of the Navy, Washington, D.C.

[21] Appl. No.: 241,997

[22] Filed: Mar. 9, 1981

[51] Int. Cl.$^3$ ............................................... C30B 9/04
[52] U.S. Cl. ............................ 156/624; 156/DIG. 66
[58] Field of Search ............... 156/DIG. 70, DIG. 66, 156/622, 624; 252/181.1, 181.6; 148/171; 427/86

[56] References Cited

U.S. PATENT DOCUMENTS

| | | | |
|---|---|---|---|
| 3,632,431 | 1/1972 | Andre et al. | 117/201 |
| 3,649,382 | 3/1972 | Hawrylo | 148/171 |
| 3,756,955 | 9/1973 | Touchy | 252/62.3 GA |
| 4,052,252 | 10/1977 | Lockwood et al. | 156/622 |

OTHER PUBLICATIONS

Hackh's Chemical Dictionary, 4th Ed., 1969, McGraw-Hill, N.Y. p. 682.

Condensed Chemical Dictionary, 8th Ed., 1971, Van Nostrand, pp. 954, 955.
Handbook on Semiconductors, Keller, v. 3, North-Holland, 1980, pp. 457, 492, 494.

Primary Examiner—Hiram Bernstein
Attorney, Agent, or Firm—R. S. Sciascia; Charles D. B. Curry; William C. Daubenspeck

[57] ABSTRACT

In a process for growth of a layer of semiconductor material by precipitation from a solution of the semiconductor material in a solvent by liquid phase epitaxial growth (LPE), the improvement is the step of adding from approximately 0.01% to 1.0% by weight of a material which forms a stable oxide or sulfide and is soluble in the solvent to the solution prior to the step of precipitating the semiconductor layer to eliminate the deleterious effects of residual oxygen. A relatively short annealing time is required to dissolve the addition in the solvent and allow the addition to react with dissolved oxygen or other impurities before a conventional LPE growth process may be initiated, although high temperature anneals of varying length may precede or follow the addition of the oxide-forming or sulfide-forming material. Zirconium, titanium, vanadium, scandium, yttrium, and aluminum are in general suitable for use as the oxide-forming material.

12 Claims, 1 Drawing Figure

U.S. Patent  Feb. 1, 1983  4,371,420
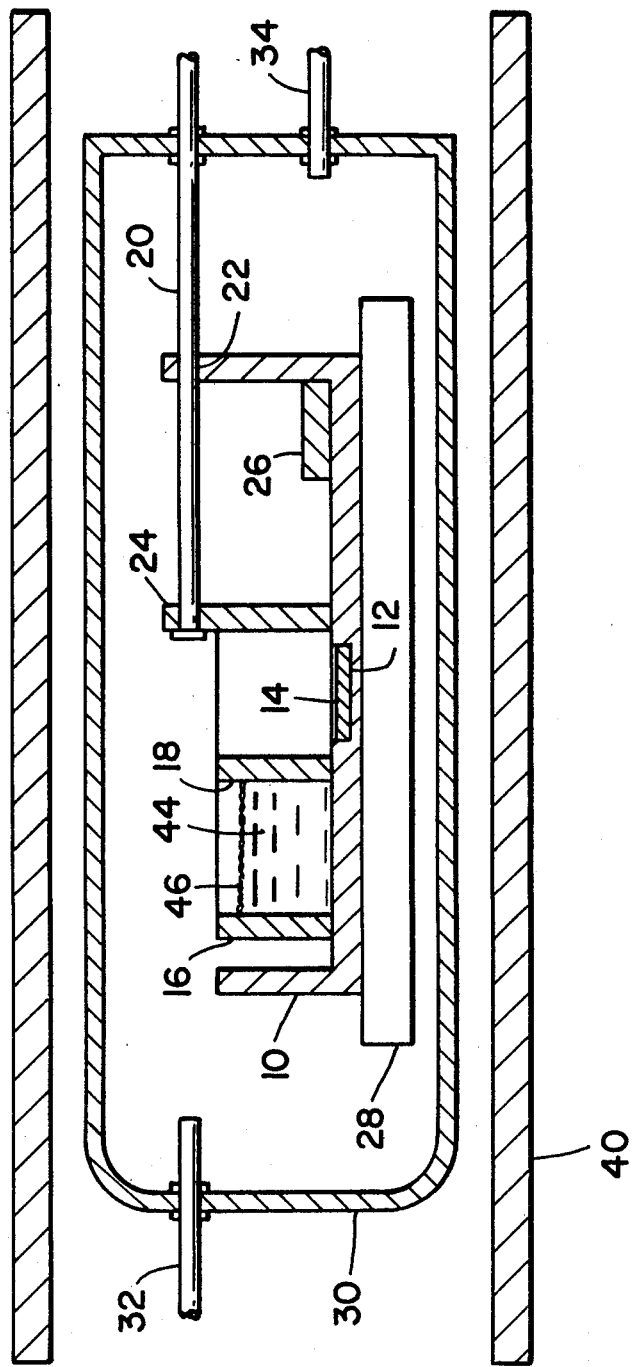

METHOD FOR CONTROLLING IMPURITIES IN LIQUID PHASE EPITAXIAL GROWTH

BACKGROUND OF THE INVENTION

1. Field of the Invention

This invention relates in general to liquid phase epitaxial (LPE) crystal growth and, in particular, to a method for controlling the deleterious effects of impurities on the electronic properties of crystals grown by LPE processes. This invention relates especially to a method for controlling the effects of residual oxygen on the electronic properties of semiconductors layers formed by LPE growth.

2. Description of Prior Art

Liquid phase epitaxial deposition is one of the principal methods used to manufacture compound semiconductors such as those in which an element of group III of the periodic table is reacted with an element of group V or an element of group II is reacted with an element of group VI. These compound semiconductors often have properties which make them attractive for use in electronic devices, particularly those which operate at high frequencies. However, the consistent preparation of high quality active layers has posed a serious limitation for use of these semiconductor compounds.

One of the most persistent problems has been the deoxygenation procedures that are used in the preparation of crystal layers by LPE growth. The importance of controlling oxygen levels in LPE growth has been well documented. Consider, for example, the III-V compound semiconductor gallium arsenide (GaAs), which has the unusual combination of a large band gap and a high electron mobility which make it particularly attractive for high frequency devices. There are reports that defects in GaAs crystals are substantially increased if a few parts per million (ppm) of oxygen are present in the LPE growth ambient and that there is a decrease in carrier mobility with increasing oxygen in the growth ambient. Most prior procedures for LPE growth have utilized an extended hydrogen anneal (approximately 20 hours) in the temperature range 600°–900° C. of the liquid gallium solvent prior to growth for the purpose of removing oxygen (and possibly sulfur) from the liquid gallium solvent. Properties, such as the carrier density, the carrier type, and the mobility, are profoundly influenced by the time and temperature of the anneal as well as the nature of the liquid gallium ambient during the anneal—for example, the purity of the hydrogen protective atmosphere and the materials in contact with the liquid gallium and hydrogen.

There is documentation of changes from n- to p-type conduction with increasing pregrowth annealing temperatures and of optimum annealing times in order to attain the highest mobilities. These observations suggest that there are beneficial and detrimental aspects of the pregrowth hydrogen anneal; the beneficial aspect concerns the removal of oxygen, a donor, from the gallium melt but with a concurrent contamination with C or Si acceptors. The existence of C- and Si-containing species at the ppm level in purified hydrogen has been confirmed using molecular beam mass spectrometry. During the long times required for the deoxygenation of the gallium melt with hydrogen, it is probable that C and Si acceptor impurities are incorporated as the oxygen donor is removed, thus explaining the n- to p-type conversion of the specimen.

At least partly because of this variable and unpredictable interaction of the ambient with the condensed phase of the system during the prolonged pregrowth anneal, the prior art methods of LPE growth have not been entirely satisfactory in consistently providing high quality semiconductor layers.

SUMMARY OF THE INVENTION

It is an object of the present invention to provide a method for consistently preparing high quality semiconductor layers by LPE growth.

Another object of the present invention is to reduce the time required to produce high quality semiconductor layers by LPE growth.

A further object of the present invention is to provide a more rapid and efficient method of impurity control in the preparation of semiconductor layers by LPE growth.

Still another object of the present invention is to control the effects of residual impurities in LPE crystal growth so that they do not deleteriously effect the electronic properties of the layers.

A further object of the present invention is to provide a more complete deoxygenation and removal of other impurity donors in LPE crystal growth.

In a method according to the present invention, the conventional LPE growth process is modified in that approximately 0.01% to 1.0% by weight of a oxide-forming species is dissolved in the solution of the semiconductor material to be deposited from the solvent prior to the programmed cooling. The oxide-forming species must be soluble in the solvent and the oxide formed must not be incorporated in the subsequently formed crystal so as to deleteriously effect the electronic properties. Virtually any element which forms a stable oxide is a candidate for the addition such as zirconium, titanium, vanadium, scandium, yttrium, and aluminum. A relatively short annealing time (a few minutes to an hour) is required to allow the dissolution of the addition in the solvent and the reaction of the addition with the dissolved oxygen before a conventional LPE growth procedure may be initiated. However, a conventional high temperature anneal of varying lengths may precede or follow the addition of the oxide-forming element to the solution within the scope of the present invention.

BRIEF DESCRIPTION OF THE DRAWING

The single FIGURE is a schematic cross-sectional representation illustrating apparatus for performing crystal growth by LPE deposition.

DESCRIPTION OF THE PREFERRED EMBODIMENT

Referring now to the drawing, the present invention may be practiced using a conventional liquid phase epitaxial deposition apparatus as illustrated in the FIGURE. The slider-type apparatus represented in the FIGURE includes a boat 10 of inert refractory material such as graphite. A cavity 12 for receiving a seed crystal 14 is formed in the bottom of the boat 10. The depth of the cavity is chosen so that the top surface of the seed crystal 14 is lower than the surface of the bottom of the boat 10. A slider 16, similarly of inert material, and having a well 18, is disposed in the boat 10. An actuator rod 20 extends through an aligning aperture 22 in the wall of the boat 10 to attach to a flange 24 of the slider 16. The actuator rod 20 provides a means for moving the slider 16 in a horizontal direction to allow the well 18 to be over the cavity 12. A stop 26 is provided to simplify alignment of the well 18 over the cavity 12. The boat 10 is disposed on a hollow quartz platform 28 within a quartz containment tube 30 through which high purity hydrogen flows via inlet 32 and outlet 34. The containment tube 30 is positioned in a tubular furnace 40 which provides a flat temperature zone along the length of the boat 10 to provide controlled heating of the apparatus within the containment tube. The temperature of the apparatus within tube 30 is monitored by a thermocouple (not shown) which couples its measurements to a programmed temperature controller (not shown). Suitable gas-impervious seals and feed through devices are provided for the containment tube 30 to maintain the high quality hydrogen atmosphere.

In the typical prior art LPE growth procedure, a charge consisting of a mixture of the semiconductor material of the epitaxial layer to be desposited and a solvent for the semiconductor material is first annealed in a hydrogen protective atmosphere at specific temperatures for a period of from 16 to 24 hours for the purpose of removing impurities, principally oxygen, from the solvent. For this purpose, the cold charge is placed in the well 18 of the slider 16 with the slider disposed as shown in the FIGURE. The charge is then heated in the high purity hydrogen atmosphere within the containment tube 30 at the prescribed temperature for the prescribed duration. The apparatus is then cooled and a seed crystal 14 is introduced into the cavity 12. Next the growth system is heated to the saturation temperature of the mixture of the semiconductor material in the solvent and maintained at the temperature for, typically, thirty minutes to one hour. This saturation state is represented in the FIGURE with the well 18 containing liquid solvent 44 which has crystals 46 of the dissolved semiconductor on the surface of the liquid. After the prescribed period of time at the saturation temperature, the solution is transferred onto the substrate by moving the slider 16 to position the well 18 over the seed crystal 14 in the cavity 12. The apparatus now provides a programmed cooling to supersaturate the melt and induce epitaxial deposition. When the desired amount of deposition is achieved, the slider 16 is returned to its previous position.

The present invention modifies the foregoing process by requiring the direct addition of chemical species which form stable oxides to the mixture of the semiconductor material and the solvent prior to the time when the mixture (a solution at this stage of the process) undergoes the programmed cooling to induce LPE deposition. Virtually any element which forms a stable oxide is a candidate for this addition. Further considerations for the additive are: (1) that the species be soluble in the solution of the solvent and (2) that the species do not produce deleterious electronic activity in the semiconductor crystal. Zirconium, titanium, vanadium, scandium, yttrium, and aluminum are examples of elements which will generally satisfy the foregoing requirements. Zirconium and titanium were studied initially because of their extensive use as oxygen getters in gas purification systems. With regard to the amount of the addition, the maximum amount will generally be limited by the inherent solubility of the addition in the solvent. As will be apparent from the experimental examples given hereinafter, amounts of additions well under 1.0% have beneficial effects on the electronic properties of the LPE crystal. In general, the level of the addition may vary from approximately 0.01% to 1.0% by weight in the solvent.

After the addition of the oxide-forming species to the mixture, it is a requirement of the present invention that the mixture be annealed at sufficient temperature for at least sufficient time to allow dissolution of the species in the solvent and to allow a reaction of the species with the dissolved oxygen in the solvent. As long as this just-recited annealing requirement is fulfilled, there are many permissible variations in the deoxygenation process according to the present invention in which the addition of the oxide-forming species may be combined with an extended high-temperature anneal. For example, a process according to the present invention includes a process having a prolonged high-temperature anneal of the semiconductor material in the solvent in which the oxide-forming species is added to the mixture at any time from the beginning of the prolonged anneal to shortly before the step of controlled cooling to induce epitaxial deposition as long as the above requirement is satisfied (i.e. sufficient annealing time is allowed for dissolution of the species in the solvent and interaction of the species with the dissolved oxygen). Alternatively, the duration of the high-temperature anneal of the mixture, with or without the oxide-forming species, may be adjusted or even eliminated entirely as long as the required condition is satisfied.

EXPERIMENTAL RESULTS

The method of the present invention was compared with the prior art method in the LPE growth of gallium arsenide in gallium. Zirconium and titanium were chosen as the oxide-forming additions because they form stable oxides and it was felt that they were more likely to react with the impurity donors in the melt (principally oxygen and sulfur) without extensive solubility in the semiconductor layer.

The experimental LPE growth procedures, for the most part, used a conventional tilt furnace system rather than a slider system as illustrated in the FIGURE; however, since there were often problems in complete removal of the solvent after growth with the tilt system, a conventional slider system was employed for some of the growths. The growth substrates were (100) chromium-doped GaAs wafers having a resistivity of approximately $10^4$–$10^7$ ohm-cm, a thickness of about 0.4–0.5 mm and an area of about 1 cm. The apparatus was cleaned and the growth side of the substrate was polished and cleaned by conventional procedures. Semiconducting-grade 69s Ga was used as a solvent, undoped polycrystalline GaAs as a source, and zirconium and titanium wire were used as additions.

Table I is a summary of the growth conditions and properties of representative LPE GaAs layers grown employing the prior art deoxygenation method and also of representative LPE GaAs layers grown employing the deoxygenation technique of the present invention.

TABLE 1
Summary of Growth Conditions and Properties of GaAs Layers

| Conventional Method | Pregrowth Annealing Temp(C.) | Pregrowth Annealing Time(Hr) | Growth Temp Interval | Mobility (295 K.) ($cm^2v^{-1}sec^{-1}$) | Carrier Concentration (295 K.) ($cm^{-3}$) | Material Type |
|---|---|---|---|---|---|---|
| (no addition) | 748 | 20 | 748–738 | 4680 | $6 \times 10^{16}$ | n-type |
| | 800 | 25 | 745–733 | 6000 | $5 \times 10^{15}$ | n-type |
| | 800 | 18 | 748–736 | 8000 | $1.1 \times 10^{15}$ | n-type |
| CHEMICAL DEOXIDATION | | | | | | |
| Ti addition | | | | | | |
| 0.162 wt % | 750 | 24 | 691–677 | 7300 | $1.7 \times 10^{15}$ | n-type |
| Ti addition | 750 | 24 | 691–171 | 5300 | $1.4 \times 10^{15}$ | n-type |
| 0.19 wt % | 800 | 18 | 757–743 | 370 | $1.9 \times 10^{15}$ | p-type |
| 0.19 wt % | 800 | 24 | 761–743 | 360 | $4.3 \times 10^{15}$ | p-type |
| 0.24 wt % | 800 | 17 | 760–739 | 300 | $3.7 \times 10^{15}$ | p-type |
| Zr addition | | | | | | |
| 0.6 wt % | 600 | 120 | 750–740 | 220 | $1.08 \times 10^{15}$ | p-type |
| | 750 | 18 | 750–740 | 210 | $7.18 \times 10^{15}$ | p-type |
| | 690 | 19 | 698–680 | 223 | $1.8 \times 10^{14}$ | p-type |

For this series of runs (performed with a tilt technique), layers grown by conventional methods were always n-type, layers grown with Zr additions were always p-type, irrespective of the temperature of the pregrowth anneal, and Ti additions produced n-type layers for lower annealing temperature (750° C.) and p-type layers for higher annealing temperature (800° C.). This transition from n type to p type with increasing annealing temperatures has been observed in conventional LPE processes; however, the process employing the titanium addition produced p-type material with an anneal of 800° C. whereas the conventional process with a similar anneal produced n-type material.

The experimental data show that the additions of zirconium and titanium decrease the tendency of the material to be n-type (believed to arise from the residual donor impurities, oxygen and sulfur) with the zirconium having the greater effect. This difference correlates with the fact that zirconium forms a much more stable oxide than titanium and thus may provide a more complete removal of oxygen donors. Another possible explanation for the effectiveness of the present invention might be that the additions are incorporated in the GaAs layer as acceptors. However, the observed high mobilities (measured by the Van der Pauw technique) and the observed temperature dependence of the mobility (data not shown) support the supposition that the zirconium and titanium act primarily as getters to form inactive species rather than electrically active dopants. All the LPE growth procedures presented in Table I included a prolonged pregrowth anneal.

It can be seen that the present invention enables high quality LPE layers to be grown without requiring a prolonged pregrowth anneal for deoxygenation. The elimination of the prolonged pregrowth anneal greatly reduces the time for LPE process and avoids the deleterious effects on the layers which have been attributed to the prolonged anneal. However, the addition of an oxide-forming species to the pregrowth solution can be used with pregrowth anneals of varying lengths to provide more complete deoxygenation and removal of other impurity donors than in the conventional LPE process. In general, the addition of oxide-forming species reduces the annealing time and/or temperature required to provide a specific level of deoxygenation in the LPE process. It is also possible to use this technique for the bulk growth of compound semiconductors to remove appropriate impurities.

Obviously, many modifications and variations of the present invention are possible in light of the above teachings. It is therefore to be understood that within the scope of the appended claims, the invention may be practiced otherwise than as described.

What is claimed is:

1. In a process for growth of a layer of undoped semiconductor material by precipitation from a solution of the semiconductor material in a solvent by liquid phase epitaxial growth, the improvement comprising the step of adding from approximately 0.01% to 1.0% by weight of a material which forms an oxide and is soluble in the solvent to the solution prior to the step of precipitating said layer of semiconductor material.

2. In the process as recited in claim 1 the improvement further including, subsequent to the step of adding the material which forms an oxide, the step of heating the solution to dissolve said material which forms an oxide in the solvent.

3. In the process as recited in claim 1 the improvement further including, subsequent to the step of adding the material which forms an oxide, the step of annealing the solution for sufficient time at sufficient temperature to dissolve said material which forms an oxide in said solvent and allow said material which forms an oxide to react with the impurities in the solution.

4. The improvement as recited in claim 1 or 2 or 3 wherein the step of adding an oxide-forming material comprises the step of adding at least one material from the group consisting of zirconium, titanium, vanadium, scandium, yttrium and aluminum to the solution prior to the step of precipitating said layer of semiconductor material.

5. The improvement as recited in claim 1 or 2 or 3 wherein the step of adding an oxide-forming material comprises the step of adding titanium to the solution prior to the step of precipitating said layer of semiconductor material.

6. The improvement as recited in claim 1 or 2 or 3 wherein the step of adding an oxide-forming material comprises the step of adding zirconium to the solution prior to the step of precipitating said layer of semiconductor material.

7. In a process as recited in claim 1, the improvement further including, subsequent to the step of adding the material which forms an oxide, the step of annealing said solution for a prolonged period of time so that the material which forms an oxide may react with the impurities in the solution.

8. In a process for precipitating a layer of undoped gallium arsenide from a solution of undoped gallium arsenide in gallium by liquid phase epitaxial growth, the improvement comprising the step of adding from 0.01% to 1.0% by weight of material which form an oxide and is soluble in gallium to the solution prior to the step of precipitating said layer of gallium arsenide.

9. The process as recited in claim 8 wherein said material which forms an oxide and is soluble in gallium is titanium.

10. The process as recited in claim 8 wherein said material which forms an oxide and is soluble in gallium is zirconium.

11. The process as recited in claim 8 wherein the step of adding an oxide forming material comprises the step of adding at least one material from the group consisting of zirconium, titanium, vanadium, scandium, and yttrium.

12. In a process for growth of a layer of undoped semiconductor material by precipitation from a solution of the semiconductor material in a solvent by liquid phase epitaxial growth, the improvement being a step for controlling the deleterious effects of impurities which comprises the step of adding from approximately 0.01% to 1.0% by weight of at least one material from the group consisting of zirconium, titanium, vanadium, scandium, yttrium and aluminum.

* * * * *